United States Patent
Voigt et al.

(10) Patent No.: US 8,929,468 B1
(45) Date of Patent: Jan. 6, 2015

(54) COMMON-MODE DETECTION WITH MAGNETIC BYPASS

(75) Inventors: Daniel E. Voigt, Milpitas, CA (US); Paul Langner, Fremont, CA (US)

(73) Assignee: Aquantia Corp., Milpitas, CA (US)

( * ) Notice: Subject to any disclaimer, the term of this patent is extended or adjusted under 35 U.S.C. 154(b) by 207 days.

(21) Appl. No.: 13/523,826

(22) Filed: Jun. 14, 2012

(51) Int. Cl.
*H04B 1/10* (2006.01)
*H04B 3/42* (2006.01)
*H03H 7/00* (2006.01)

(52) U.S. Cl.
USPC .......................... 375/258; 370/284; 336/177

(58) Field of Classification Search
CPC ............ H04L 25/0272; H04L 25/0276; H01F 2027/2833
USPC ........... 370/284, 359; 375/258, 346; 336/173, 336/177
See application file for complete search history.

(56) References Cited

U.S. PATENT DOCUMENTS

| | | | |
|---|---|---|---|
| 3,506,906 A | 4/1970 | Nestor | |
| 3,671,859 A | 6/1972 | Miller | |
| 4,797,902 A | 1/1989 | Nishiguchi et al. | |
| 4,870,370 A | 9/1989 | Hedberg et al. | |
| 5,283,811 A | 2/1994 | Chennakeshu et al. | |
| 5,550,924 A | 8/1996 | Helf et al. | |
| 5,777,692 A | 7/1998 | Ghosh | |
| 5,832,032 A | 11/1998 | Overbury | |
| 5,889,511 A | 3/1999 | Ong et al. | |
| 5,910,960 A | 6/1999 | Claydon et al. | |
| 5,995,566 A | 11/1999 | Rickard et al. | |
| 5,995,567 A | 11/1999 | Cioffi et al. | |
| 6,011,508 A | 1/2000 | Perreault et al. | |
| 6,035,360 A | 3/2000 | Doidge et al. | |
| 6,052,420 A | 4/2000 | Yeap et al. | |
| 6,069,917 A | 5/2000 | Werner et al. | |
| 6,285,718 B1 | 9/2001 | Reuven | |
| 6,385,315 B1 | 5/2002 | Viadella et al. | |
| 6,424,234 B1 | 7/2002 | Stevenson | |
| 6,459,739 B1 * | 10/2002 | Vitenberg | 375/258 |
| 6,486,746 B1 * | 11/2002 | Gilbert | 333/22 R |

(Continued)

FOREIGN PATENT DOCUMENTS

| WO | WO97/40587 | 10/1997 |
|---|---|---|
| WO | WO2011/056970 A2 | 5/2011 |

OTHER PUBLICATIONS

U.S. Appl. No. 12/563,938, filed Sep. 21, 2009, Sedarat.
U.S. Appl. No. 12/604,323, filed Oct. 22, 2009, Sedarat et al.

(Continued)

*Primary Examiner* — Ahmed Elallam
(74) *Attorney, Agent, or Firm* — Lance Kreisman; Peninsula Patent Group

(57) ABSTRACT

An Ethernet cable connection system is disclosed. The system includes a magnetic package having a line interface to couple to a plurality of Ethernet line conductors, and a PHY interface to couple to a plurality of transceiver circuits corresponding to the line conductors. The magnetic package is operable to isolate the line conductors from the corresponding transceiver circuits. The system also includes a termination impedance network and a common-mode detection circuit. The termination impedance network is coupled to the magnetic package line interface. The common-mode detection circuit includes a sense impedance coupled to the termination impedance network that is operable to detect a common-mode signal associated with at least one of the plurality of Ethernet line conductors. A bypass path feeds the detected common-mode signal to the plurality of transceiver circuits without isolation by the magnetic package.

15 Claims, 7 Drawing Sheets

(56) References Cited

U.S. PATENT DOCUMENTS

| | | |
|---|---|---|
| 6,683,913 B1 | 1/2004 | Kantschuk |
| 6,690,739 B1 | 2/2004 | Mui |
| 6,711,207 B1 | 3/2004 | Amrany et al. |
| 6,734,659 B1 | 5/2004 | Fortner |
| 6,771,720 B1 | 8/2004 | Yang et al. |
| 6,924,724 B2 | 8/2005 | Grilo et al. |
| 6,934,345 B2 | 8/2005 | Chu et al. |
| 6,959,056 B2 | 10/2005 | Yeap et al. |
| 6,999,504 B1 | 2/2006 | Amrany et al. |
| 7,026,730 B1 | 4/2006 | Marshall et al. |
| 7,031,402 B2 | 4/2006 | Takada |
| 7,103,013 B1 | 9/2006 | Kim et al. |
| 7,123,117 B2 | 10/2006 | Chen et al. |
| 7,164,764 B2 | 1/2007 | Zimmerman et al. |
| 7,173,992 B2 | 2/2007 | Frigon |
| 7,180,940 B2 | 2/2007 | Li et al. |
| 7,200,180 B2 | 4/2007 | Verbin et al. |
| 7,315,592 B2 | 1/2008 | Tsatsanis et al. |
| 7,333,603 B1 | 2/2008 | Sallaway et al. |
| RE40,149 E | 3/2008 | Vitenberg |
| 7,403,041 B2 * | 7/2008 | Bajdechi et al. ............... 326/86 |
| 7,440,892 B2 | 10/2008 | Tamura |
| 7,457,386 B1 | 11/2008 | Phanse |
| 7,459,982 B2 | 12/2008 | Miao |
| 7,492,840 B2 | 2/2009 | Chan |
| 7,522,928 B2 | 4/2009 | O'Mahony |
| 7,542,528 B1 | 6/2009 | Cheong |
| 7,634,032 B2 | 12/2009 | Chu et al. |
| 7,656,956 B2 | 2/2010 | King |
| 7,706,434 B1 | 4/2010 | Farjadrad |
| 7,708,595 B2 | 5/2010 | Chow et al. |
| 8,094,546 B2 | 1/2012 | Schenk |
| 8,139,602 B2 | 3/2012 | Meier |
| 8,284,007 B1 * | 10/2012 | Langner et al. ............... 336/145 |
| 8,320,411 B1 * | 11/2012 | Sedarat et al. ............... 370/503 |
| 8,442,099 B1 * | 5/2013 | Sederat ........................ 375/219 |
| 8,472,532 B2 * | 6/2013 | Schley-May et al. ......... 375/258 |
| 8,625,704 B1 | 1/2014 | Sedarat et al. |
| 2003/0186591 A1 | 10/2003 | Jensen et al. |
| 2003/0223488 A1 | 12/2003 | Li et al. |
| 2003/0223505 A1 | 12/2003 | Verbin et al. |
| 2004/0010203 A1 | 1/2004 | Bibian et al. |
| 2004/0023631 A1 | 2/2004 | Deutsch et al. |
| 2004/0164619 A1 * | 8/2004 | Parker et al. ..................... 307/80 |
| 2004/0213366 A1 | 10/2004 | Ono |
| 2004/0239465 A1 | 12/2004 | Chen et al. |
| 2004/0252755 A1 | 12/2004 | Jaffe et al. |
| 2004/0257743 A1 * | 12/2004 | Chen et al. ..................... 361/119 |
| 2005/0018777 A1 | 1/2005 | Azadet |
| 2005/0025266 A1 | 2/2005 | Chan |
| 2005/0053229 A1 | 3/2005 | Tsatsanis et al. |
| 2005/0097218 A1 * | 5/2005 | Sultenfuss et al. ............. 709/238 |
| 2005/0123081 A1 | 6/2005 | Shirani |
| 2005/0135489 A1 | 6/2005 | Ho et al. |
| 2005/0203744 A1 | 9/2005 | Tamura |
| 2005/0243483 A1 * | 11/2005 | Chen et al. ..................... 361/38 |
| 2006/0018388 A1 | 1/2006 | Chan |
| 2006/0056503 A1 | 3/2006 | Keshab et al. |
| 2006/0159186 A1 | 7/2006 | King |
| 2006/0182014 A1 | 8/2006 | Lusky et al. |
| 2006/0256880 A1 | 11/2006 | Frisch |
| 2007/0014378 A1 | 1/2007 | Parhi et al. |
| 2007/0081475 A1 | 4/2007 | Telado et al. |
| 2007/0146011 A1 | 6/2007 | O'Mahony et al. |
| 2007/0192505 A1 | 8/2007 | Dalmia |
| 2007/0258517 A1 | 11/2007 | Rollings et al. |
| 2007/0280388 A1 | 12/2007 | Torre et al. |
| 2008/0089433 A1 | 4/2008 | Cho et al. |
| 2008/0095283 A1 | 4/2008 | Shoor et al. |
| 2008/0107167 A1 | 5/2008 | Tung et al. |
| 2008/0160915 A1 | 7/2008 | Sommer et al. |
| 2008/0198909 A1 | 8/2008 | Tsatsanis et al. |
| 2008/0267212 A1 * | 10/2008 | Crawley et al. ............... 370/463 |
| 2009/0061808 A1 | 3/2009 | Higgins |
| 2009/0097401 A1 | 4/2009 | Diab |
| 2009/0154455 A1 | 6/2009 | Diab |
| 2009/0161781 A1 | 6/2009 | Kolze |
| 2010/0046543 A1 | 2/2010 | Parnaby |
| 2010/0073072 A1 | 3/2010 | Ullen et al. |
| 2010/0074310 A1 | 3/2010 | Roo et al. |
| 2010/0086019 A1 | 4/2010 | Agazzi et al. |
| 2010/0111202 A1 | 5/2010 | Schley-May et al. |
| 2011/0032048 A1 | 2/2011 | Wu et al. |
| 2011/0069794 A1 | 3/2011 | Tavassoli Kilani et al. |
| 2011/0106459 A1 | 5/2011 | Chris et al. |
| 2011/0212692 A1 | 9/2011 | Hahn et al. |
| 2011/0256857 A1 | 10/2011 | Chen et al. |
| 2011/0293041 A1 | 12/2011 | Luo et al. |
| 2011/0296267 A1 | 12/2011 | Malkin et al. |
| 2013/0259175 A1 * | 10/2013 | Schley-May et al. ......... 375/346 |
| 2013/0286864 A1 * | 10/2013 | Karam .......................... 370/252 |

OTHER PUBLICATIONS

U.S. Appl. No. 12/604,351, filed Oct. 22, 2009, Sedarat et al.
U.S. Appl. No. 12/604,358, filed Oct. 22, 2009, Sedarat et al.
U.S. Appl. No. 12/977,844, filed Dec. 23, 2010, Sedarat.

* cited by examiner

COMMON-MODE DETECTION WITH MAGNETIC BYPASS

TECHNICAL FIELD

The disclosure herein relates to electronic communications, and more particularly to mitigating interference in signals transmitted over communication channels.

BACKGROUND

High-speed Ethernet systems such as 10 GBASE-T provide a convenient way to transfer data across existing cable infrastructures. FIG. 1 illustrates one end of a typical Ethernet system 100 that includes a linecard or other mounting structure 102 that receives one or more Ethernet cables 104. The cables plug into a connector interface 106 that provides magnetic isolation and electrostatic discharge (ESD) protection for plural Ethernet transceivers 108. A host computer 110 interfaces with the transceiver circuitry through a serial interface 112.

Due to the high speed of data transfer and the marginal quality of the existing infrastructure cabling, high-speed Ethernet systems are often susceptible to various sources of noise, including radio-frequency interference (RFI) noise. The transceiver circuits are also susceptible to cable discharge events (CDE). These events are generally static discharges that occur as an Ethernet cable is plugged into or comes into close proximity with a corresponding connector.

FIG. 2 illustrates one proposal for handling the problems noted above. A connector interface module 202 (corresponding to the interface 106 of FIG. 1) employs a magnetic package that includes plural transformer circuits 204A-204D that each couple to a respective twisted pair differential Ethernet channel. This effectively isolates each transceiver from CDE events. Termination circuitry 206 provides matching termination impedances for each of the channels. One of the differential channels is tapped for sensing a common-mode signal across a termination resistor, and the common-mode signal is fed into a dedicated transformer circuit 208 via a common-mode detection path 210. The transceiver circuits access the detected common-mode signal and derive a value indicating a level of RFI noise associated with the common-mode signal. Filter circuitry compensates for the noise based on the derived value.

While the separate common-mode channel architecture works well for its intended applications, a separate transformer circuit is utilized, thereby increasing the cost associated with the magnetic package. Accordingly, what is needed is a system and associated method that minimizes cost associated with the magnetic package, yet still provides the capability to cancel the RFI.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of an Ethernet cable connection system are disclosed. In one embodiment, the system includes a magnetic package having a line interface to couple to a plurality of Ethernet line conductors, and a PHY interface to couple to a plurality of transceiver circuits corresponding to the line conductors. The magnetic package is operable to isolate the line conductors from the corresponding transceiver circuits. The system also includes a termination impedance network and a common-mode detection circuit. The termination impedance network is coupled to the magnetic package line interface. The common-mode detection circuit includes a sense impedance coupled to the termination impedance network that is operable to detect a common-mode signal associated with at least one of the plurality of Ethernet line conductors. A bypass path feeds the detected common-mode signal to the plurality of transceiver circuits without isolation by the magnetic package.

In a further embodiment, an Ethernet transceiver integrated circuit is disclosed. The circuit includes a plurality of data ports operable to couple to differential physical channels that are isolated from corresponding line conductors via respective transformer circuits. A common-mode port is operable to receive a common-mode signal from a bypass path that does not interface with an isolation transformer.

In yet another embodiment, a method of providing a common-mode signal associated with one or more line conductors to an Ethernet transceiver chip is disclosed. The method includes magnetically isolating the one or more line conductors from corresponding transceiver circuits formed on the Ethernet transceiver chip; detecting a common-mode signal from at least one of the line conductors; generating a sensed common-mode signal from the detected common-mode signal; and presenting the sensed common-mode signal to the transceiver circuitry along a bypass path without magnetically isolating the sensed common-mode signal.

Figure 1:
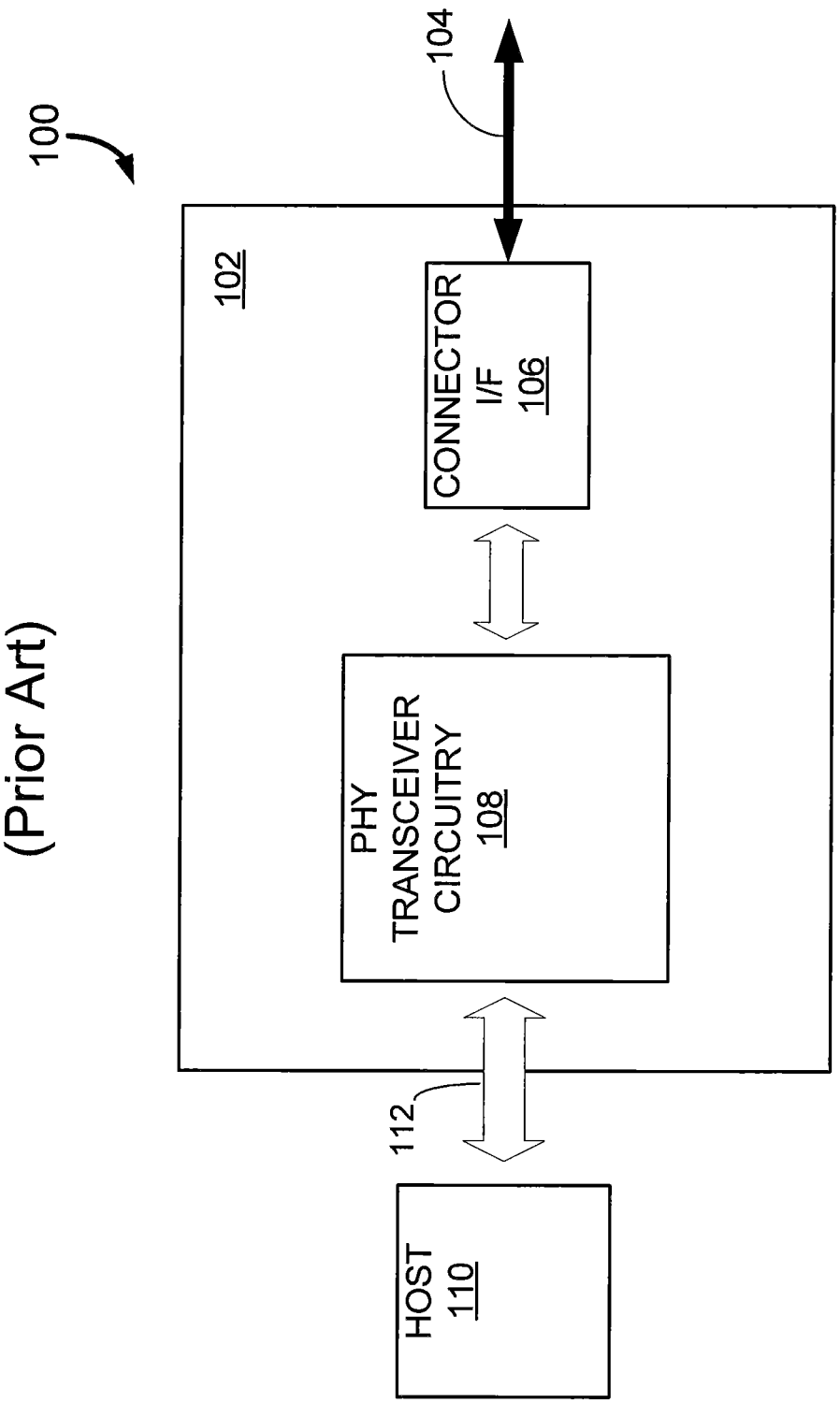
FIG. 1 illustrates a conventional high-speed Ethernet system.
Figure 2:
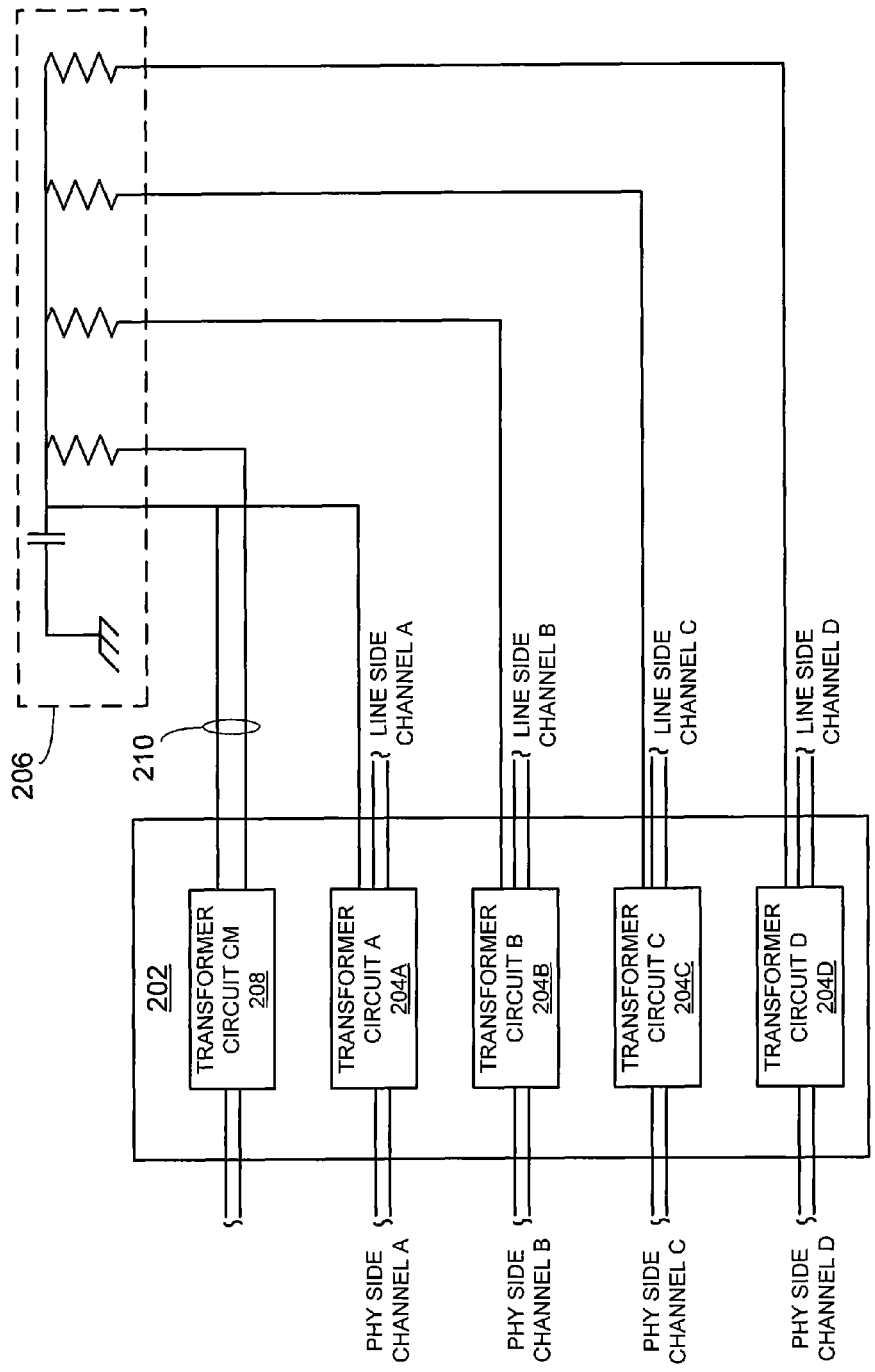
FIG. 2 illustrates one embodiment of a conventional magnetic package that provides a separate transformer for a common-mode path.
Figure 3:
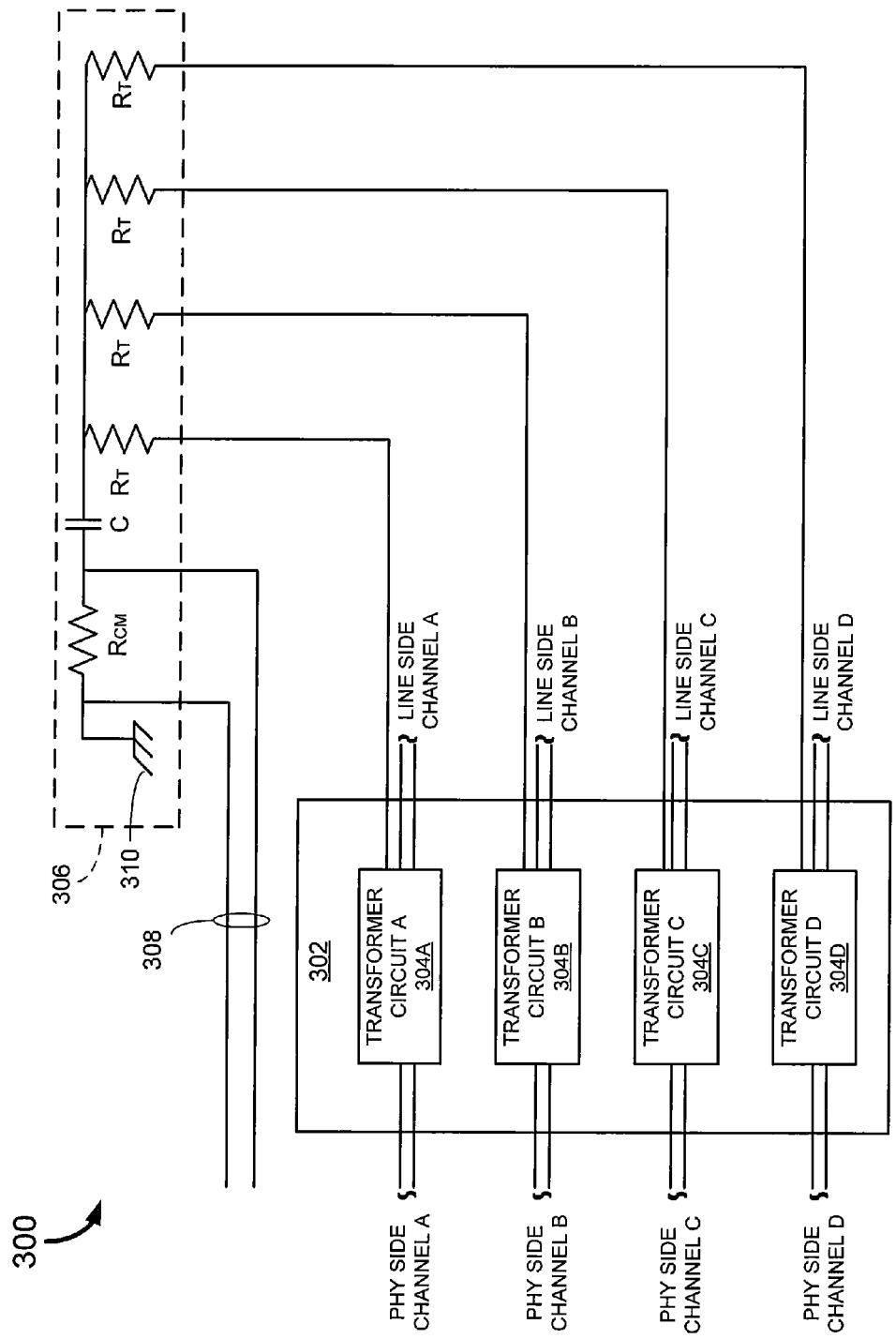
FIG. 3 illustrates one embodiment of a common-mode detection circuit that employs a path to bypass a magnetic package.

FIG. 3 is a block diagram illustrating one embodiment of a common-mode detection circuit that provides a common mode signal for presentation to the transceiver circuits, and avoids the use of an additional transformer channel through a magnetic package 302. The magnetic package includes a line interface that includes plural transformer circuits 304A-304D that each receive a differential signal from the "line" side of corresponding sets of twisted-pair wires associated with, for example respective physical (PHY) 10 GBASE-T Ethernet transceiver channels. The transformer circuits include respective interfaces that transfer the differential signals between the transformers and corresponding physical (PHY) transceiver circuits (such as the transceiver 400 shown in FIG. 4).

Further referring to FIG. 3, the common-mode detection circuit 300 is associated with a unique impedance termination circuit 306 in order to sense the common-mode signal associated with at least one of the differential twisted pair channels. In one embodiment, each differential twisted pair cable has a termination resistor $R_T$ associated with it that generally matches the cable impedance. A high-voltage capacitor C provides DC isolation of the termination resistors from a chassis ground connection 310. To detect the common-mode signal, a sense impedance $R_{CM}$ is provided in series with the high-voltage capacitor C between the capacitor and ground. The sense impedance $R_{CM}$ is also in the AC ground path for each of the termination resistors $R_T$, thereby providing access to the common-mode signal. A voltage across the common-mode resistor is sensed by a common-mode bypass path 308. In one embodiment, each of the termination resistor values are 75 ohms while the common-mode resistor is 50 ohms. An exemplary value for the high-voltage capacitor is 1000 pF.

With the common-mode signal detected and placed on the bypass path 308, it may be directly fed to the PHY transceiver circuitry, thus bypassing the magnetic package 302 and avoiding the cost of a separate transformer. Alternatively, the bypass path may be routed through the magnetic package, but without the need for coupling to a separate transformer. The termination network may be included in the magnetic package, or in a line card or other structure associated with the Ethernet system.

Figure 4:
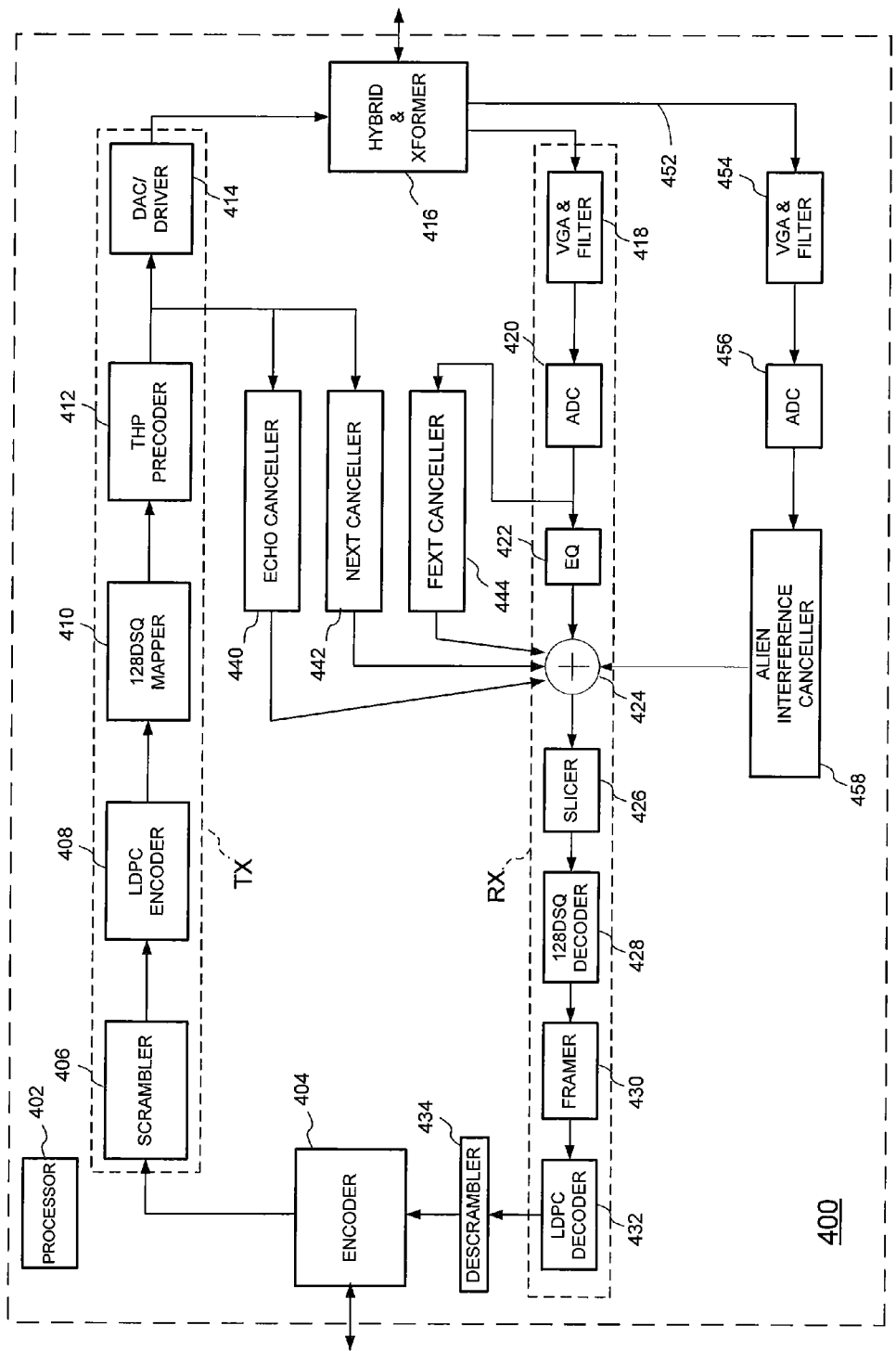
FIG. 4 illustrates one embodiment of a transceiver circuit.

FIG. 4 is a block diagram illustrating one example of a transceiver circuit, generally designated 400, suitable for use with the common-mode detection circuit of FIG. 3. This example is suitable for a 10 GBASE-T standard, but other different configurations and types of transceiver components can be used in other embodiments for 10 GBASE-T or for other, different communication standards. For explanatory purposes, the example shown in FIG. 4 illustrates a single transmitter path TX per channel and a single receiver path RX per channel for data. Multiple such paths or channels are provided in embodiments having multiple channels, e.g., four of the transmitter paths and the receiver data paths shown in FIG. 4 are used in the 10 GBASE-T standard, one path for each channel.

One or more processors 402 are typically included in transceiver 400, or connected to the transceiver to control various operations for transceiver components described below. In the transmitter path TX, an encoder 404 can be used to encode data desired to be transmitted in a particular desired format or standard, followed by a scrambler 406 for self-synchronized scrambling of the data to be transmitted, providing clock transitions, a statistically random power spectrum for EMI (electromagnetic interference) control, equalizer convergence, etc. A low density parity check (LDPC) encoder 408 encodes the data according to the parity check for error correction. A 128 DSQ mapper 410 (or other type of mapper) then can use a coset-partitioned constellation to map the data to symbols, and each 128-DSQ symbol is transmitted using two back-to-back PAM-16 signals (Pulse Amplitude Modulation, 16 levels). A Tomlinson-Harashima Precoding (THP) precoder 412 can then adjust the signal to assist the far-end receiver in performing signal equalization. An analog front end (AFE) for the transmitter can include a digital-to-analog converter (DAC) and driver block 414 which converts the data to analog form for transmission and transmits the data via the hybrid coupler and transformer block 416 to the channel output port.

In a receiver portion of the transceiver 400, data is received at the hybrid coupler and transformer block 416. Four data communication channels are used in a 10 GBASE-T embodiment (other amounts of channels can be used in other embodiments), and are sent to an analog front end (AFE) for the receiver which can include a variable gain amplifier (VGA) and filter 418 for filtering, and an analog-to-digital converter (A/D) 420. An equalizer block 422 can include one or more equalizers to remove inter-symbol interference (ISI). The output of the equalizer block 422 is summed with the outputs of a plurality of filters 440, 442 and 444 (described below) at adder 424, and the output of the adder can be provided to a slicer 426 which can provide an average noise level in the received signal. The signal can then be provided to a DSQ128 decoder 428, which outputs decoded data to a framer 430 that extracts frames from the received data and provides the frames to an LDPC decoder 432 which error-corrects the data. The data can then be provided to a descrambler 434 which outputs de-scrambled data to the encoder 404 for provision to a connected computer system, processor, or other device.

The filters 440, 442 and 444 are used to reduce echo and crosstalk (NEXT and FEXT) noise which may be introduced in the transmission and reception of data over one or more of the four communication channels. The filters cancel out the effect of signal echo and crosstalk from adjacent lines to achieve an acceptable bit error rate. The output of the THP precoder 412 in the transmitter portion TX is provided to the Echo canceller 440 and the NEXT canceller 442, which calculate the values for cancellation of echo and NEXT and output these values to the adder 424. Similarly, the output of ADC 420 is provided to the FEXT canceller 444, which calculates the values for cancellation of FEXT and outputs the values to the adder 424. The digital values of echo and crosstalk calculated by the filter are subtracted from the incoming noisy analog data (digitized by ADC 420) by adder 424 to provide received data on each channel with reduced noise.

The common mode signal detected by the circuit in FIG. 3 is provided to the hybrid & transformer block 416 that feeds the signal along a path 452 to an analog front end (AFE) that is dedicated to the common mode path, including a variable gain amplifier (VGA) and filter 454, and an analog to digital converter (ADC) 456. The output of the ADC 456 is provided to an alien interference canceller block 458, and fed to summing node 424.

The transceiver circuit exhibits certain signaling parameters that initially undergo a standard training sequence to achieve fully-functional nominal operation of data communication over a signaling link. The training sequence also establishes an initial clock synchronization that establishes a phase-locked condition between link partners. The nominal operation is a predefined level of operation at which parameters are at a particular target level (such as bit error rate being under a particular target rate), and for which the transceiver can transmit and receive data over the link. The full training sequence is a predefined sequence of stages or steps known by the link partners, although the boundaries of the stages can be overlapped or blurred in some embodiments. The sequence typically occurs at a predefined point of operation, such as at startup when a transceiver is powered on or is first connected to a communication link. During nominal operation, after the full training sequence, the transceiver continues to adapt parameters (i.e., a continuous adaptation) to changing characteristics of the link based on received data. In one embodiment, more fully described in copending U.S. application Ser. No. 12/551,347, filed Aug. 31, 2009, entitled Fast Retraining For Transceivers In Communication Systems, and assigned to the assignee of the present invention, the training sequence may be shortened to reduce training time.

Figure 5:
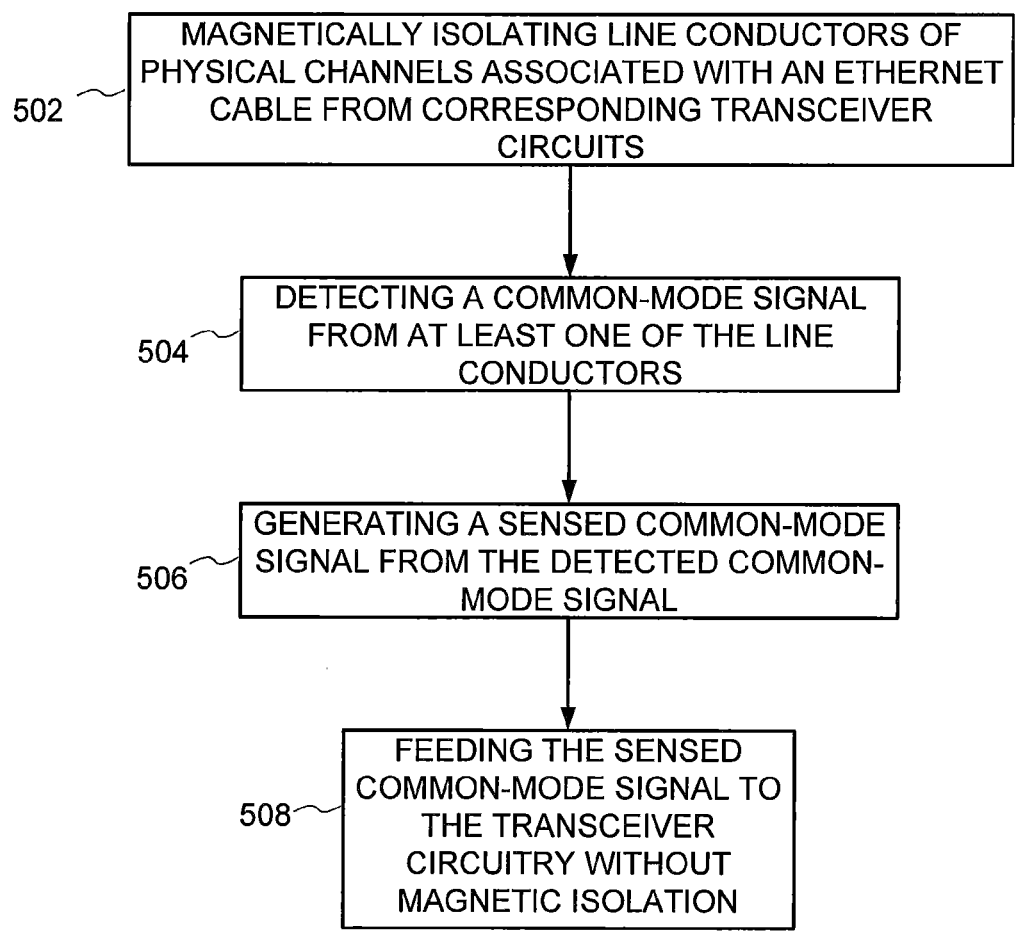
FIG. 5 illustrates a flow diagram illustrating a method of providing a common-mode signal to an Ethernet transceiver circuit.

Operation of the common mode detection circuit, in one embodiment, involves steps generally set forth in the flow diagram of FIG. 5. The method includes magnetically isolating the line conductors of the Ethernet physical channels from corresponding PHY transceiver circuits, at step 502. As explained above, this is generally performed in order to minimize the risk of CDE acting on the PHY integrated circuits due to charging of the cable to very high voltages. A common mode signal is then detected from at least one of the line conductors, at 504. A sensed common mode signal is generated from the detected common mode signal, at 506, and fed to the transceiver circuitry without magnetic isolation, at step 508. By avoiding magnetic isolation, costs associated with the magnetic isolation of the differential channels may be minimized.

Figure 6:
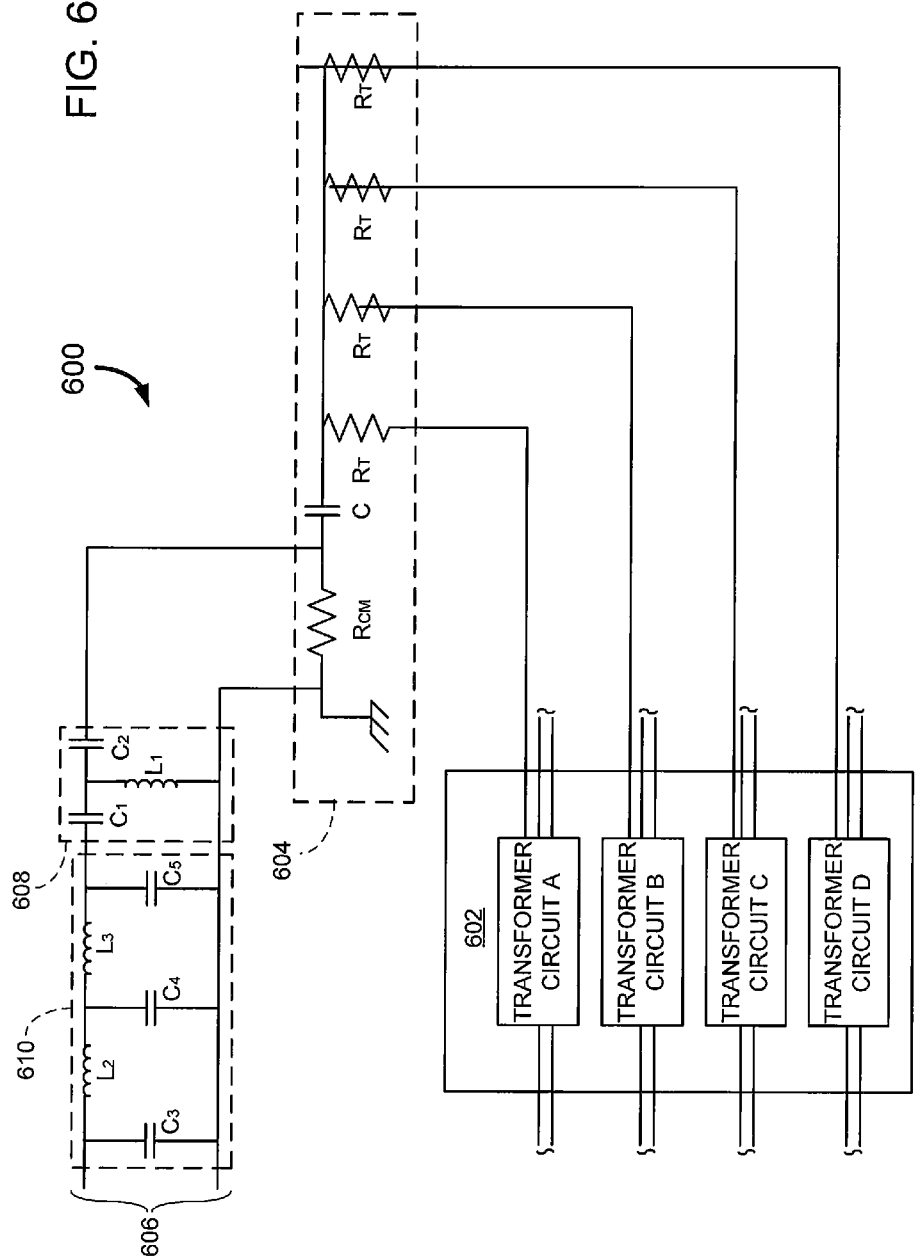
FIG. 6 illustrates an alternative embodiment of a common-mode detection circuit similar to the circuit of FIG. 3.

FIG. 6 illustrates a further embodiment of a common mode detection circuit similar to that illustrated in FIG. 3. This embodiment includes a magnetic package 602 and a termination impedance network 604 that are similar to the magnetic package and termination impedance network of FIG. 3. However, additional circuitry that carries out a filter function is included in a bypass path 606 that carries the common mode signal.

Further referring to FIG. 6, the bypass path 606 incorporates a high-pass filter 608 in series with a low-pass filter 610 that together provide a bandpass filter characteristic. The high-pass filter includes an LC arrangement with a pair of capacitors C1 and C2 disposed in one leg of the bypass path 606 and an inductor L positioned between the capacitors and interconnecting the legs of the bypass path. The low-pass filter includes inductors L2 and L3 disposed in one leg of the bypass path, while plural capacitors C3, C4 and C5 are disposed on each end of the inductors and interconnect the bypass path legs. In one embodiment, the bandpass characteristic filters frequencies below 50 MHZ and higher than 800 MHz.

The bandpass filtering not only attenuates signals at frequencies outside the defined band, but also reduces the peak energy associated with those signals. As a result, where the risk of CDE is high, the bypassed common mode path 606 can be fed directly to the transceiver PHY's with a higher level of safety via the inclusion of the filter circuitry 608 and 610.

Figure 7:
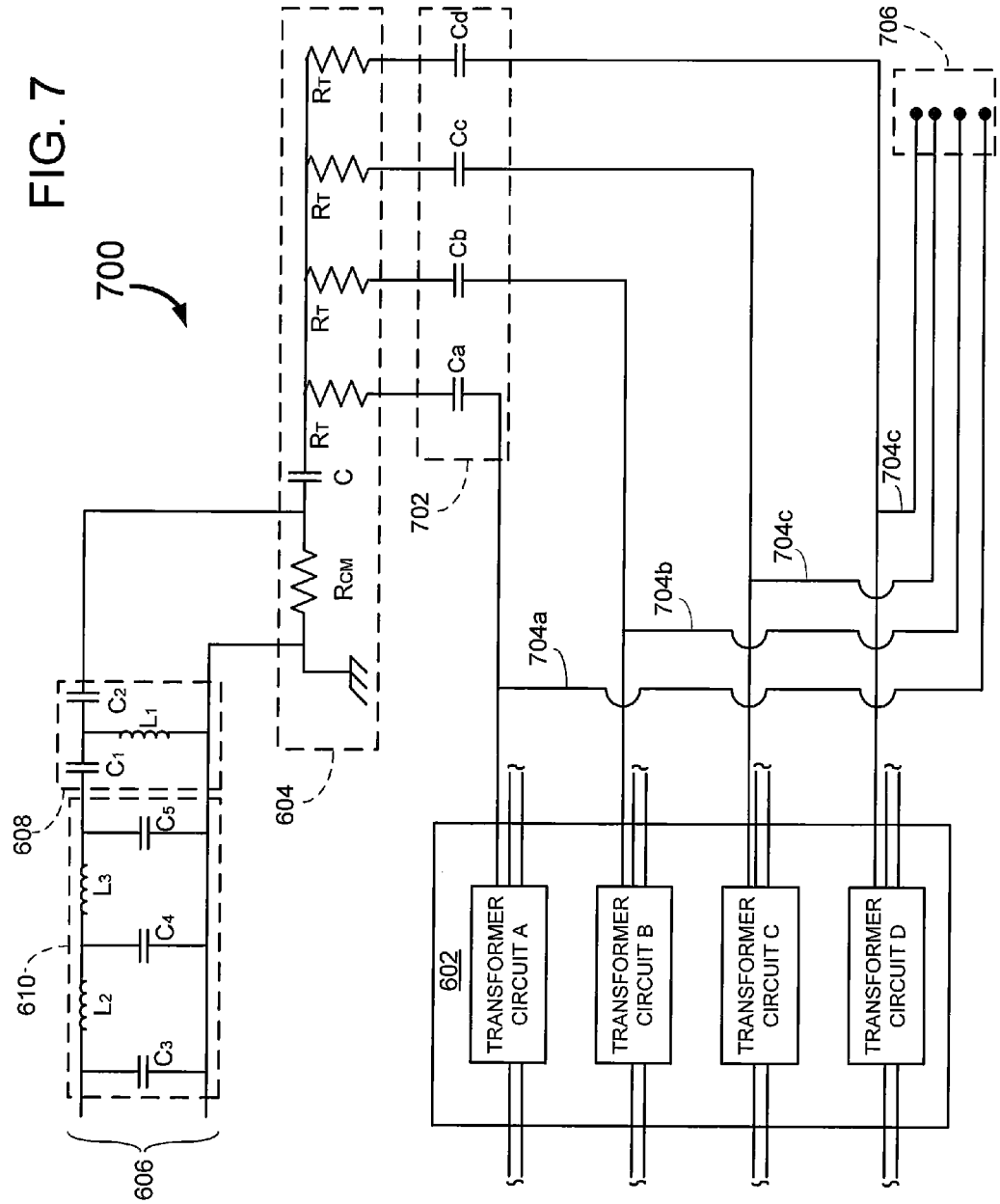
FIG. 7 illustrates a further embodiment of a common-mode detection circuit similar to the circuit of FIG. 6.

A further embodiment, illustrated in FIG. 7, allows for the ability to provide a power-over-ethernet capability. This involves modifying the embodiment of FIG. 6 slightly to include a bank 702 of capacitors Ca-Cd disposed between the magnetic package 602 and the termination network 603. Each of the capacitors has one end coupled in series with a corresponding termination resistor $R_T$, and the other end coupled to a center tap of a transformer circuit. A plurality of power paths 704a-704d are coupled to the capacitors Ca-Cd to provide respective power connections at 706 for each of the 10 GBASE-T physical channels.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An Ethernet cable connection system comprising:
   a magnetic package having a line interface to couple to a plurality of Ethernet line conductors, and a PHY interface to couple to a plurality of transceiver circuits corresponding to the line conductors, the magnetic package operable to isolate the line conductors from the corresponding transceiver circuits;
   a termination impedance network coupled to the magnetic package line interface; and
   a common-mode detection circuit including
      a sense impedance coupled to the termination impedance network and operable to detect a common-mode signal associated with at least one of the plurality of Ethernet line conductors, and
   a bypass path to feed the detected common-mode signal to the plurality of transceiver circuits without isolation by the magnetic package.

2. The Ethernet cable connection system according to claim 1 wherein:
   the sense impedance is disposed in series between a high-voltage capacitor and a ground terminal.

3. The Ethernet cable connection system according to claim 2 wherein the sense impedance comprises a resistor no larger than 50 ohms and the high-voltage capacitor has a capacitance no less than 1000 pF.

4. The Ethernet cable connection system according to claim 1 wherein the common-mode detection circuit further includes a high-pass filter.

5. The Ethernet cable connection system according to claim 4 wherein the high-pass filter substantially attenuates signals having frequencies less than 50 MHz.

6. The Ethernet cable connection system according to claim 5 and further comprising a low-pass filter coupled serially to the high-pass filter to define a bandpass filter.

7. The Ethernet cable connection system according to claim 1 wherein the Ethernet line conductors comprise four pairs of twisted-pair copper wires.

8. The Ethernet cable connection system according to claim 1 wherein the Ethernet line conductors carry data signals at data rates of up to 10 Gbps in accordance with a 10 GBASE-T signaling system.

9. The Ethernet cable connection system according to claim 1 wherein a peak voltage across the sense impedance is no greater than 120V.

10. An Ethernet transceiver integrated circuit comprising:
a plurality of data ports operable to couple to differential physical channels that are isolated from corresponding line conductors via respective transformer circuits; and
a common-mode port operable to receive a common-mode signal from a bypass path that does not interface with the transformer circuits.

11. The Ethernet transceiver integrated circuit according to claim 10 wherein the Ethernet transceiver integrated circuit is embodied in a 10 GBASE-T transceiver chip.

12. A method of providing a common-mode signal associated with one or more line conductors to an Ethernet transceiver chip, the method comprising:
magnetically isolating the one or more line conductors from corresponding transceiver circuits formed on the Ethernet transceiver chip;
detecting a common-mode signal from at least one of the line conductors;
generating a sensed common-mode signal from the detected common-mode signal; and
presenting the sensed common-mode signal to the transceiver circuits along a bypass path without magnetically isolating the sensed common-mode signal.

13. The method according to claim 12 wherein generating the sensed common-mode signal comprises generating the sensed common-mode signal based on a sum of a plurality of resistances.

14. The method according to claim 12 and further comprising:
attenuating the sensed common-mode signal before presenting to the transceiver circuits.

15. The method according to claim 14 wherein the attenuating comprises bandpass filtering to pass signals having frequencies between 50 MHz and 800 MHz.

\* \* \* \* \*